(12) United States Patent
Yamauchi

(10) Patent No.: US 10,034,347 B2
(45) Date of Patent: Jul. 24, 2018

(54) OUTPUT CIRCUIT

(71) Applicant: Renesas Electronics Corporation, Koutou-ku, Tokyo (JP)

(72) Inventor: Takashi Yamauchi, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/683,334

(22) Filed: Aug. 22, 2017

(65) Prior Publication Data

US 2017/0354015 A1 Dec. 7, 2017

Related U.S. Application Data

(63) Continuation of application No. 15/269,161, filed on Sep. 19, 2016, now Pat. No. 9,820,352, which is a continuation of application No. 14/590,544, filed on Jan. 6, 2015, now Pat. No. 9,474,124, which is a continuation of application No. 13/330,031, filed on Dec. 19, 2011, now Pat. No. 8,957,652.

(30) Foreign Application Priority Data

Dec. 22, 2010 (JP) .................. 2010-286091

(51) Int. Cl.
*H05B 33/08* (2006.01)
*H03K 17/082* (2006.01)

(52) U.S. Cl.
CPC ..... *H05B 33/0887* (2013.01); *H03K 17/0822* (2013.01); *H05B 33/089* (2013.01); *H05B 33/0815* (2013.01); *H03K 2217/0027* (2013.01)

(58) Field of Classification Search
CPC .. H05B 33/089; H05B 33/0815; H05B 39/02; H05B 33/0884; H05B 33/081; H05B 33/0881; H05B 33/0875
USPC .......................................................... 315/128
See application file for complete search history.

(56) References Cited

U.S. PATENT DOCUMENTS

| 6,246,555 | B1 | 6/2001 | Tham |
| 6,813,170 | B2 | 11/2004 | Yang |
| 7,015,680 | B2 | 3/2006 | Moraveji et al. |
| 7,148,670 | B2 | 12/2006 | Inn et al. |
| 7,405,916 | B2 | 7/2008 | Ohshima |
| 7,504,783 | B2 | 3/2009 | Zarr |
| 7,679,876 | B2 | 3/2010 | Ong et al. |
| 8,031,496 | B2 | 10/2011 | Saji |

(Continued)

FOREIGN PATENT DOCUMENTS

| JP | 2006-024997 A | 1/2006 |
| JP | 2009-148043 A | 7/2009 |

*Primary Examiner* — Kyle J Moody
(74) *Attorney, Agent, or Firm* — Foley & Lardner LLP

(57) ABSTRACT

There is provided an output circuit for supplying an output current to a load coupled to an output terminal in response to an input signal. The output circuit includes an output transistor for supplying the output current to the output terminal, an output-drive circuit for driving the output transistor, a constant-current limiting circuit for generating a current control signal for limiting the output current to a predetermined current value, and a control circuit for implementing a control such that the output current is controlled on the basis of the current control signal if a voltage at the output terminal is at a predetermined voltage, or less after the input signal is supplied while the output transistor is driven by the output-drive circuit if the voltage at the output terminal is in excess of the predetermined voltage.

5 Claims, 8 Drawing Sheets

(56) References Cited

U.S. PATENT DOCUMENTS

| | | |
|---|---|---|
| 8,040,116 B2 | 10/2011 | Xia et al. |
| 8,144,487 B2 | 3/2012 | Djenguerian et al. |
| 8,169,204 B2 | 5/2012 | Jian |
| 8,456,096 B2 | 6/2013 | Kwok et al. |
| 8,598,859 B2 | 12/2013 | Furuichi et al. |
| 8,674,671 B2 | 3/2014 | Hikichi et al. |
| 8,957,652 B2 | 2/2015 | Yamauchi |
| 9,474,124 B2 | 10/2016 | Yamauchi |
| 2002/0015319 A1 | 2/2002 | Hartular et al. |
| 2003/0141856 A1 | 7/2003 | Kimura |
| 2006/0028188 A1 | 2/2006 | Hartular et al. |
| 2006/0087303 A1 | 4/2006 | Hartular et al. |
| 2007/0108949 A1 | 5/2007 | Ohoka |
| 2007/0159736 A1 | 7/2007 | Kajita |
| 2008/0136342 A1 | 6/2008 | Tamegai et al. |
| 2010/0123443 A1 | 5/2010 | Grimm |
| 2010/0156324 A1 | 6/2010 | Nagase et al. |
| 2011/0043179 A1 | 2/2011 | Liu et al. |
| 2013/0329462 A1 | 12/2013 | Duvnjak |

OUTPUT CIRCUIT

CROSS-REFERENCE TO RELATED APPLICATIONS

This application is a continuation of U.S. application Ser. No. 15/269,161, filed Sep. 19, 2016, which is a continuation U.S. application Ser. No. 14/590,544, filed Jan. 6, 2015, now U.S. Pat. No. 9,474,124, which is a continuation of U.S. application Ser. No. 13/330,031, filed Dec. 19, 2011, now U.S. Pat. No. 8,957,652, which claims benefit of priority from the prior Japanese application no. 2010-286091, filed on Dec. 22, 2010; the entire contents of all of which are incorporated herein by reference.

BACKGROUND

The present invention relates to an output circuit.

With an output circuit of a semiconductor integrated circuit, an overcurrent protection circuit is mounted thereon in order that if a trouble occurs to an interconnect, or a load, coupled to the output circuit, and an overcurrent is caused to flow, an output transistor of the output circuit is turned OFF to thereby protect the load, or the integrated circuit. In Japanese Unexamined Patent Publication No. 2006-24997, there has been disclosed a technology for incorporating the overcurrent protection circuit. The technology disclosed in Japanese Unexamined Patent Publication No. 2006-24997 is concerned with a semiconductor control device capable of suppressing power loss of a MOSFET by deactivating a load circuit 10 if short-circuit to ground occurs to a load 11.

In FIG. 7, there is shown a configuration of the load circuit 10 for driving the load 11, provided in the semiconductor control device described in Japanese Unexamined Patent Publication No. 2006-24997. As shown in FIG. 7, the load circuit 10 includes MOSFETs T1, T3, a counter electromotive force detection circuit 12, a VDS detection circuit 13, AND circuits AND1, AND2, a latch circuit DF1, and a driver circuit 14.

Respective signal levels of output terminals +Q, −Q of the latch circuit DF1, in an initialized state, are such that the signal level of +Q=L (low level) and the signal level of −Q=H (high level) in a reset state when a switch SW1 is OFF. When the load 11 is driven by the load circuit 10, the switch SW1 is turned ON. In this state, one of inputs of the AND circuit AND1 is turned H (the high level), and the output terminal −Q of the latch circuit DF1 is at H (the high level), so that an output of the AND circuit AND1 is turned H (the high level). Accordingly, the driver circuit 14 is driven, whereupon the MOSFET T1 is turned ON to thereby drive the load 11.

Herein, in the case where short circuit to ground has occurred between the MOSFET T1 and the load 11, an overcurrent flows to the MOSFET T1, thereby causing an increase in a drain-source voltage VDS of the MOSFET T1, whereupon an output of the VDS detection circuit 13 makes a L (the low level) to H (the high level) transition.

Further, as a result of the transition of the output of the VDS detection circuit 13, an output of the AND circuit AND2 makes a transition from the low level to the high level. Then, the output of −Q of the latch circuit DF1 makes a transition from the high level to the low level, thereby causing the output of the driver circuit 14 to turn from the high level to the low level. At the same time, the output of +Q of the latch circuit DF1 makes a transition from the low level to the high level, causing the MOSFET T3 to turn into the ON state. Accordingly, a gate level of the MOSFET T1 becomes lower, and the MOSFET T1 is turned into the OFF state, thereby freeing an output of the load circuit 10 from a short-circuited state.

An operation of the VDS detection circuit 13 is intended to control so as to adjust a current I1 flowing through resistors R8, R9 such that the drain-source voltage VDS of the MOSFET T1 becomes equal to a voltage across the opposite ends of the resistor R8.

For example, if the voltage across the opposite ends of the resistor R8 is smaller in value than the voltage VDS of the MOSFET T1, an output of an amp AMP1 is increased to thereby increase the current I1. By so doing, the voltage across the opposite ends of the resistor R8 is caused to increase. Conversely, if the voltage across the opposite ends of the resistor R8 is larger in value than the voltage VDS of the MOSFET T1, the output of the amp AMP1 is decreased to thereby decrease the current I1. By so doing, the voltage across the opposite ends of the resistor R8 is caused to decrease. As a result, the VDS detection circuit 13 executes a control such that formula VDS=I1×R8 will hold.

An operation of the counter electromotive force detection circuit 12 is described as follows. In the case where the short circuit to ground has occurred, a short-circuit current ID is generated, and a counter electromotive force E1 occurs, the counter electromotive force E1 acting from a node P1 of a power supply interconnect 21 toward a node P0 thereof, whereupon a voltage V1 at the node P1 undergoes an abrupt decrease. In contrast, a reference power supply voltage V3 falls according to a time constant set by a capacitor C1, and resistors R1, R2. For this reason, the reference power supply voltage V3 is unable to follow the abrupt decrease in the voltage V1, so that a potential difference occurs between the voltage V1 and the reference voltage V3. If the potential difference undergoes an increase in magnitude, and a voltage across the opposite ends of the resistor R1 exceeds a predetermined level, a MOSFET T2 is turned ON.

If the MOSFET T2 is turned ON, this will cause a voltage V4 at a node coupling between resistors R3, R4 to rise to thereby turn a timer 15 ON. The timer 15 outputs a high-level signal for predetermined time. This high-level signal is delivered to one of inputs of the AND circuit AND2. Herein, respective resistance values of the resistors R1, R2 are set such that the MOSFET T2 is turned ON by the counter electromotive force E1 occurring when the short-circuit to ground has occurred, but the MOSFET T2 will not be turned ON by a counter electromotive force due to an overcurrent occurring when the MOSFET T1 is in the ON state.

Further, if the load circuit 10 is short-circuited to ground in a short circuit path, the load circuit 10 detects short circuit by use of a comparator CMP1 on the basis of the voltage VDS of the MOSFET T1, and the counter electromotive force E1, and further, the load circuit 10 latches information on short circuit by use of the latch circuit DF1, inverting the output of the AND circuit AND1, and the output of the driver circuit 14, thereby cutting off the overcurrent by turning the MOSFET T1 OFF.

The present inventor has recognized the following. With the load circuit 10 of the semiconductor control device according to a related art technology, however, if the load circuit 10 is short-circuited to ground in the short circuit path, as described in the foregoing, the load circuit 10 goes through a series of steps of starting to drive the load 11, detecting a state of the short circuit, and subsequently interrupting a load-drive current flowing through the MOSFET T1, so that there occurs an increase in current flowing through the load 11 before the load-drive current is interrupted, as shown in FIG. 8. For this reason, a line width of a power supply line in a drive circuit (the output transistor), and a width of the interconnect up to the terminal are designed on the basis of the worst value of a current value being on the increase, so that the interconnect width inevitably increases, which will pose a problem leading to enlargement of a circuit scale. In addition, the enlargement of the circuit scale will raise a problem of an increase in the cost of a semiconductor chip.

SUMMARY

According to one aspect of the present invention, there is provided an output circuit for supplying an output current to a load coupled to an output terminal in response to an input signal. The output circuit includes an output transistor for supplying the output current to the output terminal, an output-drive circuit for driving the output transistor, a constant-current limiting circuit for generating a current control signal for limiting the output current to a predetermined current value, and a control circuit for implementing a control such that the output current is controlled on the basis of the current control signal if a voltage at the output terminal is at a predetermined voltage value, or less after the input signal is supplied while the output transistor is driven by the output-drive circuit if the voltage at the output terminal is in excess of the predetermined voltage value.

With the present invention, an operation is started from a constant-current drive state in which a current outputted by the output transistor is limited to a predetermined value, and the operation can be shifted to a normal drive state unless the short circuit to ground occurs. For this reason, it becomes possible to prevent generation of a current flowing from the output terminal, the current being large in value, when the short circuit to ground has occurred.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

First Embodiment

Figure 1:
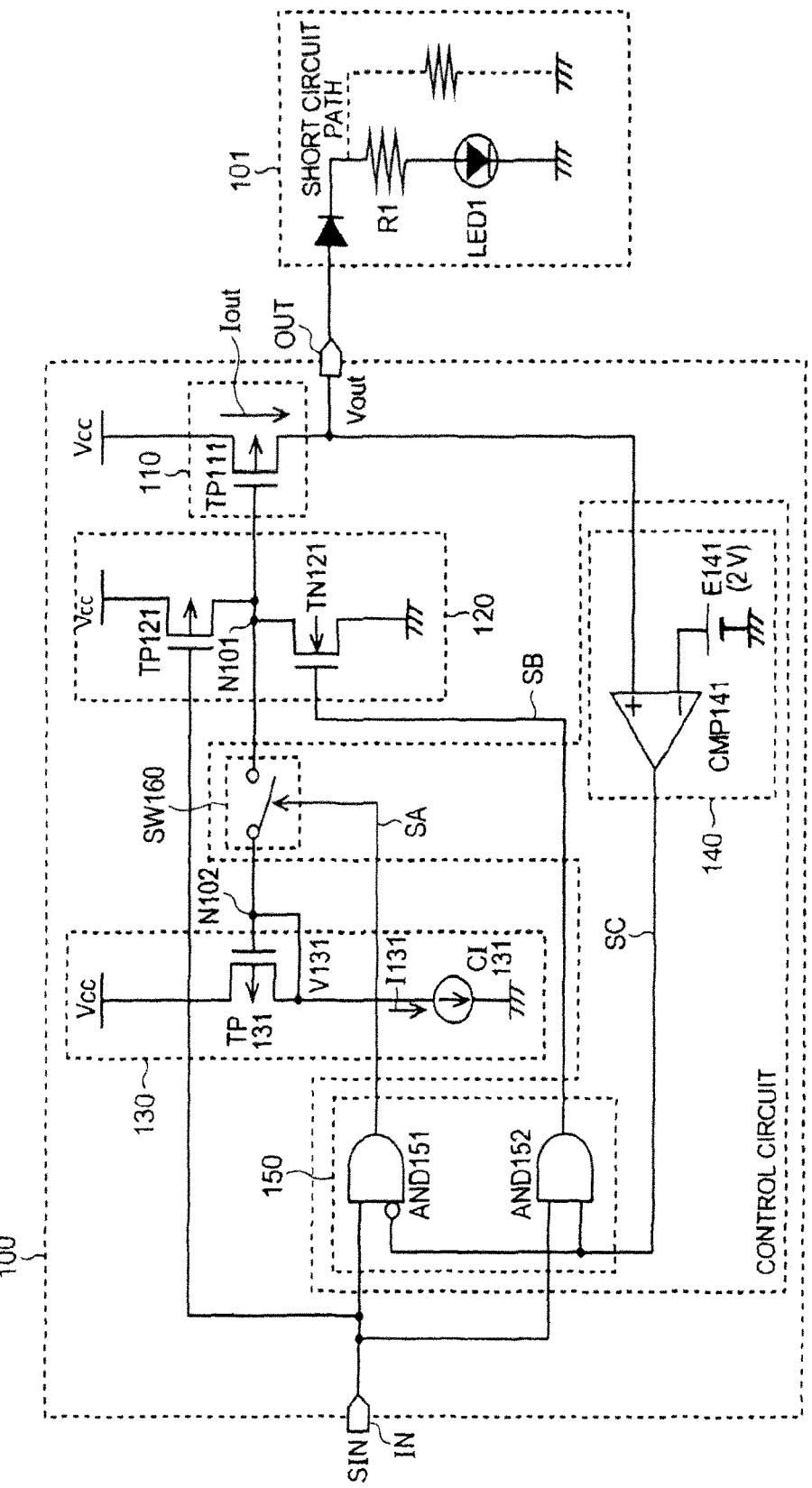
FIG. 1 is a block diagram showing a configuration of an output circuit according to a first embodiment of the invention.

A specific embodiment of the present invention, that is, a first embodiment of the invention is described in detail hereinafter with reference to the accompanying drawings. FIG. 1 shows a configuration of an output circuit 100 according to the first embodiment of the invention. The first embodiment represents a case where the present invention is applied to an output circuit for driving an LED circuit.

As shown in FIG. 1, the output circuit 100 includes an output unit 110, an output-drive circuit 120, a constant-current limiting circuit 130, an output-voltage comparison circuit 140, a drive-control circuit 150, a switch circuit SW160, an input terminal IN, and an output terminal OUT.

A load 101 is coupled to the output terminal OUT. The load 101 includes an LED circuit LED 1, a current-limiting resistor R1, and so forth. The load 101 is driven by an output current Iout that is outputted from the output terminal OUT. With the first embodiment, the LED circuit is assumed as the load 101, however, it is to be understood that the load 101 be not particularly identified as the LED circuit, and that various loads, such as a motor, a display, a battery-charging circuit, and so forth, are conceivable as the load 101.

Further, a voltage appearing at the output terminal OUT is referred to as an output voltage Vout. The output voltage Vout undergoes a change in response to a state of the load 101. In the case of the load 101 being in a normal action, a voltage according to impedance of the load 101, and the output current Iout will appear as output voltage VOUT. However, if the load 101, or an interconnect between the output terminal OUT, and the load 101 is in a short-circuited state (earth grounded) against a ground voltage GND, this will cause the output voltage Vout to fall down to a voltage in close proximity of the ground voltage GND.

The output unit 110 includes a PMOS transistor TP111 serving as an output transistor. The PMOS transistor TP111 has a source coupled to a power supply terminal Vcc, a drain coupled to the output terminal OUT, and a gate coupled to a node N101. The PMOS transistor TP111 causes the output current Iout to flow according to a voltage applied to the node 101. The output current Iout is supplied to the load 101 via the output terminal OUT.

The output-drive circuit 120 turns the PMOS transistor TP111 ON in response to an input signal SIN inputted to the input terminal IN, and a control signal SB. The output-drive circuit 120 includes a PMOS transistor TP121, and an NMOS transistor TN121.

The PMOS transistor TP121 has a source coupled to the power supply terminal Vcc, a drain coupled to the node N101, and a gate coupled to the input terminal IN. The NMOS transistor TN121 has a drain coupled to the node N101, a source coupled to a ground terminal GND. Further, the control signal SB is inputted to the gate of the NMOS transistor TN121.

The switch circuit SW 160 electrically couples a node N102 to the node N101, or cut off the node N102 from the node N101 in response to a control signal SA.

The constant-current limiting circuit 130 includes a PMOS transistor TP131, and a constant current source CI 131. The PMOS transistor TP131 has a source coupled to the power supply terminal Vcc, and both a drain and a gate, coupled to the node N102. The constant current source CI 131 is coupled between the node N102, and the ground terminal GND, and a constant current I131 is caused to flow from the node N102 toward the ground terminal GND.

When the switch circuit SW 160 is in the ON state, the PMOS transistor TP131, and the PMOS transistor TP111 configure a current mirror with the PMOS transistor TP131 serving as the input of the current mirror. Therefore, when the switch circuit SW 160 is in the ON state, the output current Iout flowing through the PMOS transistor TP111 is a current having a value according to a mirror ratio of the PMOS transistor TP131 to the PMOS transistor. TP111. For example, a ratio of TP131:TP111=a ratio of 1:10 may be adopted as the mirror ratio. However, only if the mirror ratio is a ratio according to which a current of the PMOS transistor TP131 is rendered smaller in value than that of the PMOS transistor. TP111, this may be sufficient, and the mirror ratio need not be specified to be the ratio of 1:10.

Further, because a value of the output current Iout flowing through the PMOS transistor TP111 is controlled according to a voltage at the node N102, a voltage V131 applied to the node N102 can be regarded as a current control signal.

The output-voltage comparison circuit 140 includes a comparator CMP 141, and a reference voltage source E 141.

The reference voltage source E 141 supplies a reference voltage E 141 (for example, 2 V) to an inverting input terminal of the comparator CMP 141. The reference voltage E 141 may be rendered variable without being fixed. Further, the reference voltage source E 141 can be replaced with a reference voltage terminal to which the reference voltage E 141 is supplied from outside.

The comparator CMP 141 has a non-inverting input terminal coupled to the output terminal OUT, and the output voltage Vout is inputted to the non-inverting input terminal. The reference voltage E 141 is inputted to an inverting input terminal, as described above. The comparator CMP 141 compares the output voltage Vout with the reference voltage E 141 to output a comparison result as a control signal SC.

Assuming that the reference voltage E 141 is, for example, 2 V, the comparator CMP 141 outputs the control signal SC at a low level if the output voltage Vout is lower than 2 V while the comparator CMP 141 outputs the control signal SC at a high level if the output voltage Vout is at 2 V or higher.

The drive-control circuit 150 includes AND circuits AND 151, AND 152.

The input signal SIN is inputted to one of input terminals of the AND circuit AND 151, and an inverting signal of the control signal SC is inputted to the other of the input terminals. Then, the AND circuit AND 151 outputs an operation result as the control signal SA.

The input signal SIN is inputted to one of input terminals of the AND circuit AND 152, and the control signal SC is inputted to the other of the input terminals. Then, the AND circuit AND 152 outputs an operation result as the control signal SB.

Further, the drive-control circuit 150, the output-voltage comparison circuit 140, and the switch circuit SW 160 can be regarded to configure one control circuit.

Figure 2:
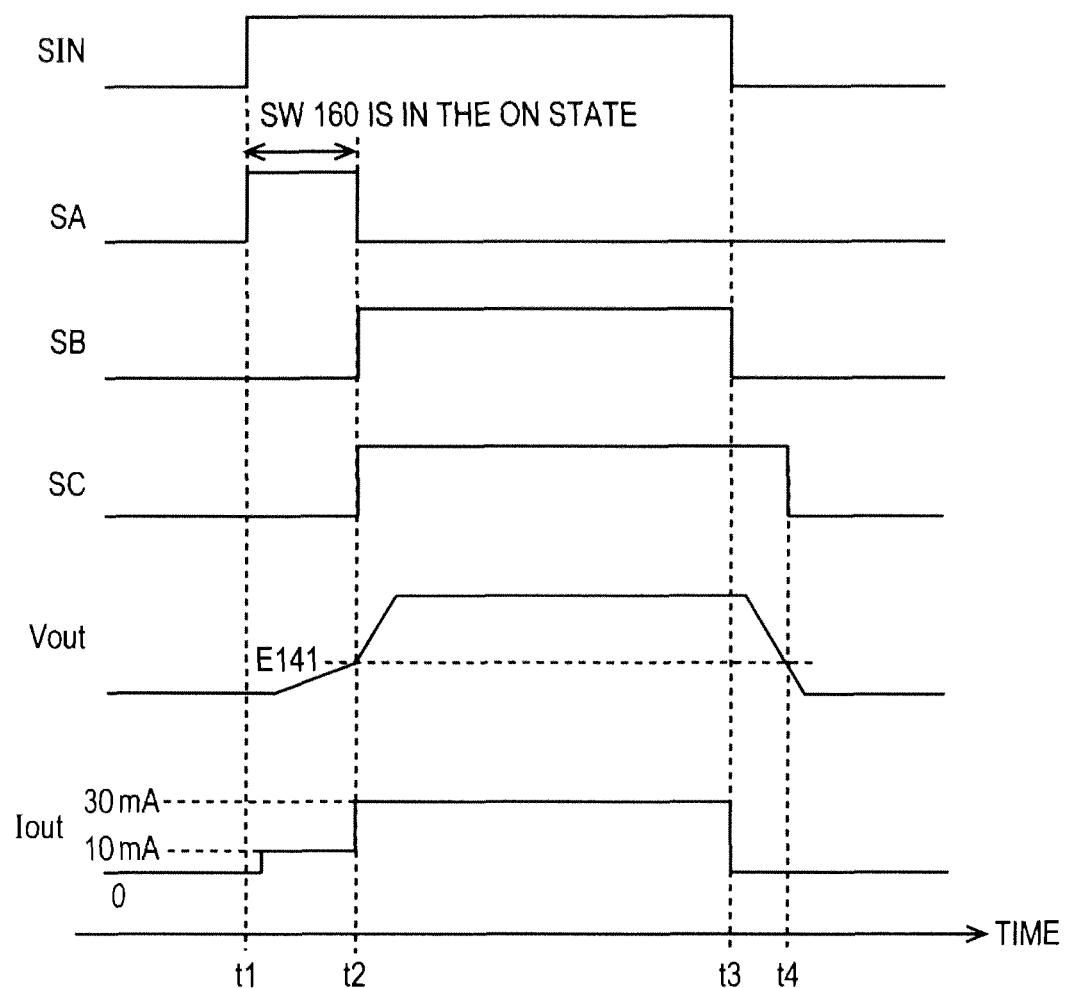
FIG. 2 is an operation timing chart in the case where short circuit to ground (earth ground) does not exist at the output circuit according to the first embodiment.
Figure 3:
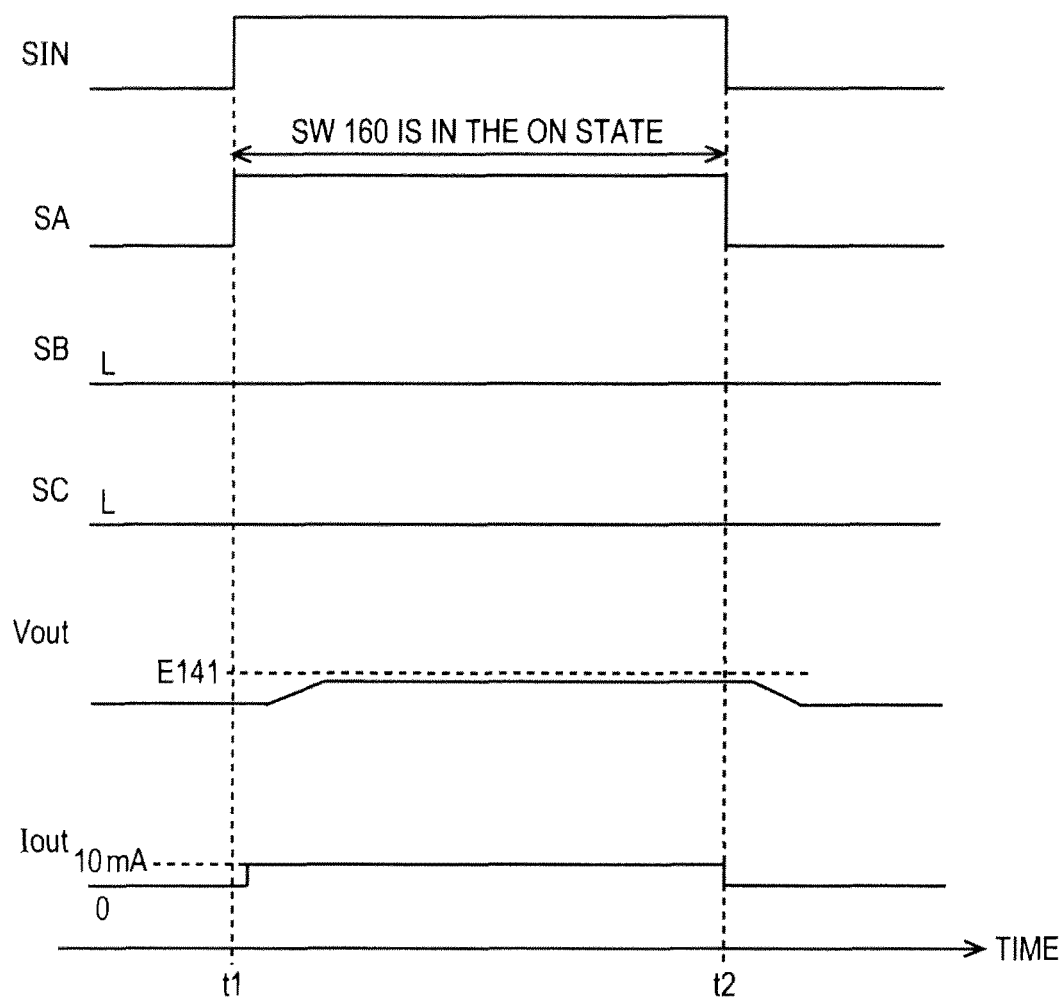
FIG. 3 is an operation timing chart in the case where the short circuit to ground (earth ground) exists at the output circuit according to the first embodiment.

Now, an operation of the output circuit 100 according to the first embodiment is described hereinafter with reference to FIGS. 2, and 3, respectively. In FIG. 2, there is shown an operation timing chart in the case where short circuit to ground (earth ground) does not exist at the load 101, and the output circuit 100 performs a normal operation. In FIG. 3, there is shown an operation timing chart in the case where the short circuit to ground (earth ground) has occurred between the output transistor TP111, and the load 101.

As shown in FIG. 2, the input signal SIN first makes a low level to a high level transition at time t1. The output voltage Vout appearing at the output terminal OUT at this point in time is at a low level (the ground voltage GND). Thus, the output voltage Vout is smaller in value than the reference voltage E 141 (for example, 2 V), so that the comparator CMP 141 of the output-voltage comparison circuit 140, outputs the control signal SC at the low level.

Because the control signal SC is at the low level, and the input signal SIN is at the high level, the control signal SA outputted by the AND circuit AND 151 of the drive-control circuit 150 is caused to make a low level to a high level transition. Further, the AND circuit AND 152 keeps the control signal SB held at the low level. As the control signal SA is caused to make the transition to the high level, the switch circuit SW 160 is turned ON.

Further, as the control signal SB remains at the low level, the NMOS transistor TN121 is in the OFF state, and as the input signal SIN is at the high level, the PMOS transistor TP121 is in the OFF state. That is, the output-drive circuit 120 is in a deactivated state, having no effect on the action of the output unit 110.

As the switch circuit SW 160 is turned ON, the node N102 is rendered electrically continuous with the node N101. In consequence, the voltage V131 as the drain voltage (the gate voltage) of the PMOS transistor TP131 of the constant-current limiting circuit 130 will be at a potential equal to that of the gate voltage of the PMOS transistor TP111 of the output unit 110. As previously described, the PMOS transistor TP131, and the PMOS transistor TP111 configure the current mirror if the switch circuit SW 160 is in the ON state. Accordingly, a current flowing through the PMOS transistor TP111 (the output current Iout) is decided according to the mirror ratio of the PMOS transistor TP131 to the PMOS transistor. TP111. In the case where the mirror ratio is set to a ratio of, for example, TP131:TP111=1:10, a current flowing through the PMOS transistor TP111 (10 mA) will be up to ten times as large as a current flowing through the PMOS transistor TP131 (assuming, for example, 1 mA). Further, a state in which a current limited by the constant-current limiting circuit 130 corresponds to the output current of the PMOS transistor TP111 serving as the output transistor is hereinafter referred to as a limited-drive state as necessary.

Next, as described above, the output current Iout flows to the load 101, and the output voltage Vout gradually rises. When the output voltage Vout exceeds the reference voltage E 141 (for example, 2 V) at time t2, the comparator CMP 141 outputs the control signal SC at the high level.

Because the control signal SC is at the high level, and the input signal SIN is at the high level, the AND circuit AND 151 causes the control signal SA to make a high level to a low level transition while the AND circuit AND 152 causes the control signal SB to make a low level to a high level transition.

As the control signal SA makes a transition to the low level, the switch circuit SW 160 is turned OFF, whereupon the node 102 is electrically cut off from the node N101. Accordingly, the voltage V131 will not be transmitted to the node N101. Further, as the control signal SB concurrently makes a transition to at the high level, the NMOS transistor TN121 is tuned ON, thereby causing the node N101 to be at the low level (the ground voltage GND). Accordingly, the PMOS transistor TP111 as the output transistor will not be in the limited-drive state as restricted by the constant-current limiting circuit 130 (the output current Iout=10 mA), but will be in a normal drive state (the output current Iout=30 mA) with the switch circuit SW 160 in the normal ON state, thereby driving the load 101.

Next, referring to FIG. 3, there is described hereinafter the case where the short circuit to ground (earth ground) has occurred between the output transistor TP111, and the load 101. As shown in FIG. 3, the input signal SIN first makes the low level to the high level transition at time t1. The output voltage Vout appearing at the output terminal OUT at this point in time is at the low level (the ground voltage GND).

Thus, the output voltage Vout is smaller in value than the reference voltage E 141 (for example, 2 V), so that the comparator CMP 141 of the output-voltage comparison circuit 140, outputs the control signal SC at the low level.

Because the input signal SIN is at the high level while the control signal SC is at the low level, the control signal SA outputted by the AND circuit AND 151 of drive-control circuit 150 is caused to make the low level to the high level transition. Further, the AND circuit AND 152 keeps the control signal SB held at the low level. As the control signal SA is caused to make a transition to the high level, the switch circuit SW 160 is turned ON.

Further, as the control signal SB remains at the low level, the NMOS transistor TN121 is in the OFF state, and as the input signal SIN is at the high level, the PMOS transistor TP121 is in the OFF state. That is, the output-drive circuit 120 is in a deactivated state, having no effect on the action of the output unit 110.

As the switch circuit SW 160 is turned ON, the node N102 is rendered electrically continuous with the node N101. In consequence, the voltage V131 as the drain voltage (the gate voltage) of the PMOS transistor TP131 of the constant-current limiting circuit 130 will be at the potential equal to that of the gate voltage of the PMOS transistor TP111 of the output unit 110. The PMOS transistor TP131, and the PMOS transistor TP111 configure the current mirror when the switch circuit SW 160 is in the ON state. The current flowing through the PMOS transistor TP111 (the output current Iout) is decided according to the mirror ratio of the PMOS transistor TP131 to the PMOS transistor TP111. If the mirror ratio is set to a ratio of, for example, 1:10 in the limited drive state, the output current flowing through the PMOS transistor TP111 (10 mA) will be up to ten times as large as the current flowing through the PMOS transistor TP131 (assuming, for example, 1 mA).

Next, as described above, the output current Iout flows to the load 101, however, since the short circuit to ground (earth ground) has occurred, the output voltage Vout at the output terminal OUT does not become higher than the reference voltage E 141 unlike the case shown on FIG. 2. Accordingly, the comparator CMP 141 keeps the control signal SC held at the low level.

Then, the switch circuit SW 160 keeps in the ON state until time t2 when the input signal SIN makes a transition to the low level, and the PMOS transistor TP111 causes flow of the current (10 mA) only in the limited drive state, allowing no current larger in value than the current.

Figure 4:
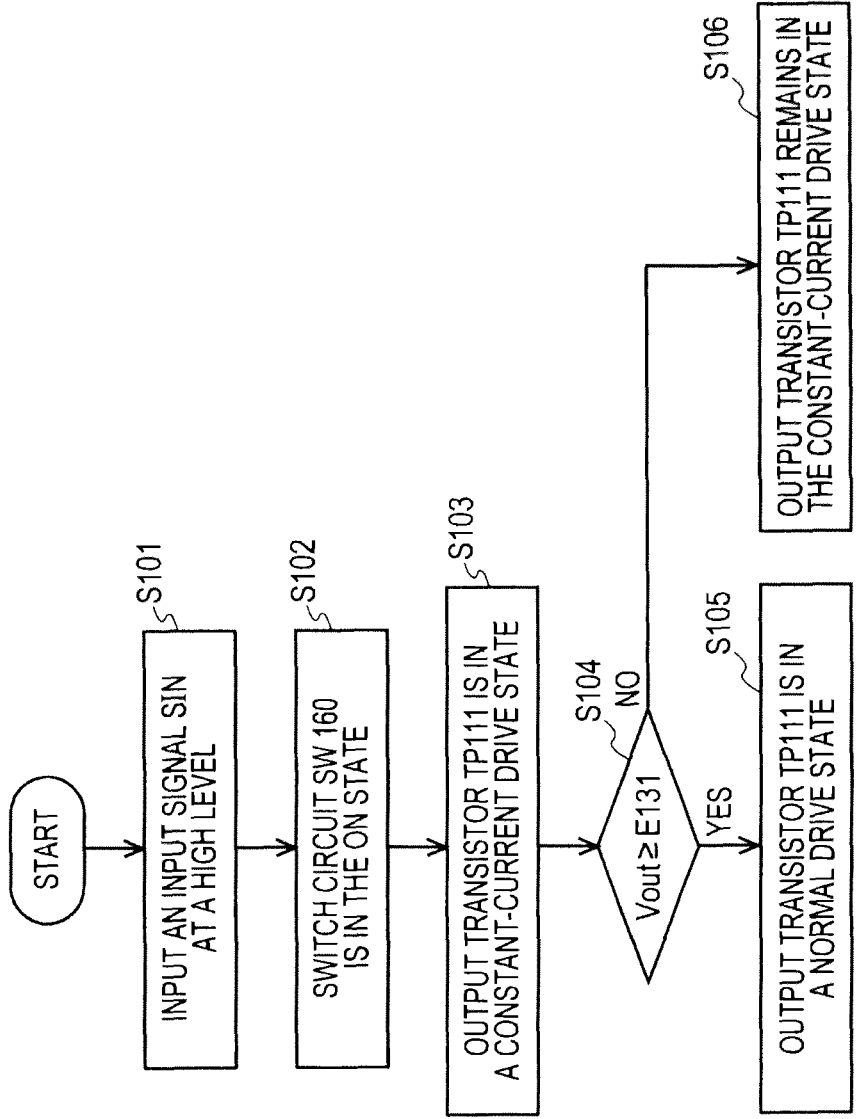
FIG. 4 is an operation flow chart of the output circuit according to the first embodiment.

In FIG. 4, there is shown an operation flow chart of the output circuit 100 according to the first embodiment of the invention. As shown in FIG. 4, the input signal SIN at the high level is first inputted (step S101).

In the case where the output voltage Vout is smaller in value than the reference voltage E 141 (for example, 2 V), the control signal SC is at the low level, and when the input signal SIN makes a transition to the high level, the control signal SA makes a transition to the high level, thereby causing the switch circuit SW 160 to be turned into the ON state (step S102).

The switch circuit SW 160 is turned ON, and a current-mirror coupling configuration is established by the PMOS transistor TP131, and the PMOS transistor TP111. A constant current according to the current mirror ratio flows to the PMOS transistor TP111, and the PMOS transistor TP111 as the output transistor is in a constant-current drive state (the limited-drive state) (step S103).

When the output voltage Vout appearing at the output terminal OUT rises to the reference voltage E 141, or higher (YES, in step S104), the control signal SC is turned to the high level, in response to which the control signal SA is turned to the low level while the control signal SB is turned to the high level. For this reason, as described with reference to FIG. 2, the switch circuit SW 160 is turned OFF, and the NMOS transistor TN121 of the output-drive circuit 120 is ON, whereupon the PMOS transistor TP111 as the output transistor is turned into the normal-drive state (step S105).

On the other hand, when the output voltage Vout appearing at the output terminal OUT is lower than the reference voltage E 141 (NO, in the step S104), the control signal SC remains at the low level, whereupon the constant-current drive state (the limited-drive state) is continued by the PMOS transistor TP111 as the output transistor (step S106).

As described above, in the case of the output circuit 100 according to the first embodiment of the invention, in the initialized state (at the time t1 shown in FIGS. 2, 3, respectively) where the input signal SIN is activated, the output voltage Vout at the output terminal OUT is at the low level (the ground voltage GND), so that in response to the comparison result (the control signal SC) of the output-voltage comparison circuit 140, the switch circuit SW 160 is tuned ON, and the output-drive circuit 120 is deactivated. Accordingly, the PMOS transistor TP111 as the output transistor is in the constant-current drive state (the limited-drive state).

Thereafter, without the occurrence of the short circuit to ground, the output voltage Vout gradually rises to reach the reference voltage E 141, or higher, whereupon, in response to the comparison result (the control signal SC) of the output-voltage comparison circuit 140, the switch circuit SW 160 is tuned OFF, and the output-drive circuit 120 is activated. Accordingly, the PMOS transistor TP111 as the output transistor is in the normal-drive state.

On the other hand, with the occurrence of the short circuit to ground, the output voltage Vout does not exceed the reference voltage E 141, so that the PMOS transistor TP111 as the output transistor remains in the constant-current drive state.

Now, a line width of an interconnect line for use in the output circuit is designed so as to meet a service life of an interconnect line, due to sufficient electromigration. The line width of the interconnect line, meeting the service life (median life) of the interconnect line, due to electromigration, has a bearing on current density. Expression (1) given below shows a common relational expression between a median life MTF, and current density J:

$$MTF = AJ^{-n}\exp\left(\frac{Ea}{kT}\right) \quad (1)$$

where A is an intrinsic constant related to a constituent material, a structure, a size, and so forth of an interconnect_line, J current density [A/cm$^2$], n a coefficient indicating dependency on current density, Ea activation energy [eV] (Ea=0.6 eV, on the basis of dependency on temperature), k Boltzmann constant (8.616×10$^{-5}$ [eV/K]), and T absolute temperature [K].

Assuming that the median life MTF is fixed at a specified value, if a current flowing to an interconnect line is increased by m-multiple, a line width of the interconnect line must be increased by m-multiple because a cross-sectional area of the interconnect line is fixed. Accordingly, with Japanese Unexamined Patent Publication No. 2006-24997, based on the related art technology, there is the need for deciding a line width of an interconnect line on the basis of the worst value of a current flowing through the interconnect line during a period between detection of the short circuit to ground, and interruption of a drive circuit (the output transistor). In other words, it has been necessary to design an interconnect line so as to have a line width that is unnecessary in the normal operation, which has posed a problem of the enlargement of a circuit scale.

Further, upon the output current flowing through the output transistor, there is generated Joule heat owing to ON resistance, and it has been necessary for a heat resistant design of the output transistor to meet a specified value. In case that heat resistance per one output transistor is unable to meet the specified value, the number of output transistors disposed in parallel with each other needs be increased. With Japanese Unexamined Patent Publication No. 2006-24997, based on the related art technology permitting a large current to flow, the number of the output transistors to be operated in parallel also needs be designed on the basis of the worst value among current values, so that the problem of the enlargement of the circuit scale will arise in this regard as well.

However, with the output circuit 100 according to the first embodiment of the invention, an operation is started from the constant-current drive state to be shifted to the normal drive state unless the short circuit to ground occurs. Accordingly, it is possible to prevent the output current large in value from being outputted during the period between the detection of the short circuit to ground, and the interruption of the drive circuit (the output transistor), the above being encountered in the case of Japanese Unexamined Patent Publication No. 2006-24997. As a result, it is possible to obtain an advantageous effect of eliminating needs for enlarging the circuit scale so as to match the worst value of the output current flowing out to the short-circuited ground, such needs having caused a problem with Japanese Unexamined Patent Publication No. 2006-24997. Hence, the enlargement of the circuit scale, in comparison with the related art technology, can be prevented, so that it is possible to obtain an advantageous effect of suppressing an increase in the cost of manufacturing a chip.

Further, in the case of the related art technology, there is a possibility that an output current large in magnitude flows from a power supply circuit toward a ground terminal during the period between the detection of the short circuit to ground, and the interruption of the drive circuit (the output transistor) after the driving of the load is started, which have raised a concern that breakage of the power supply circuit will result in the worst case.

In contrast, with the output circuit 100 according to the first embodiment of the invention, there flows no current other than the constant current set by the constant-current limiting circuit, within the scope of the assumption, even in the case of the occurrence of the short-circuit to ground, the breakage of the power supply circuit does not result, so that the invention has an advantageous effect of achieving enhancement in safety of circuits.

Second Embodiment of the Invention

Another specific embodiment of the invention, that is, a second embodiment of the invention is described in detail hereinafter with reference to the accompanying drawings. The second embodiment as well represents a case where the present invention is applied to an output circuit for driving an LED circuit, as is the case with the first embodiment.

Figure 5:
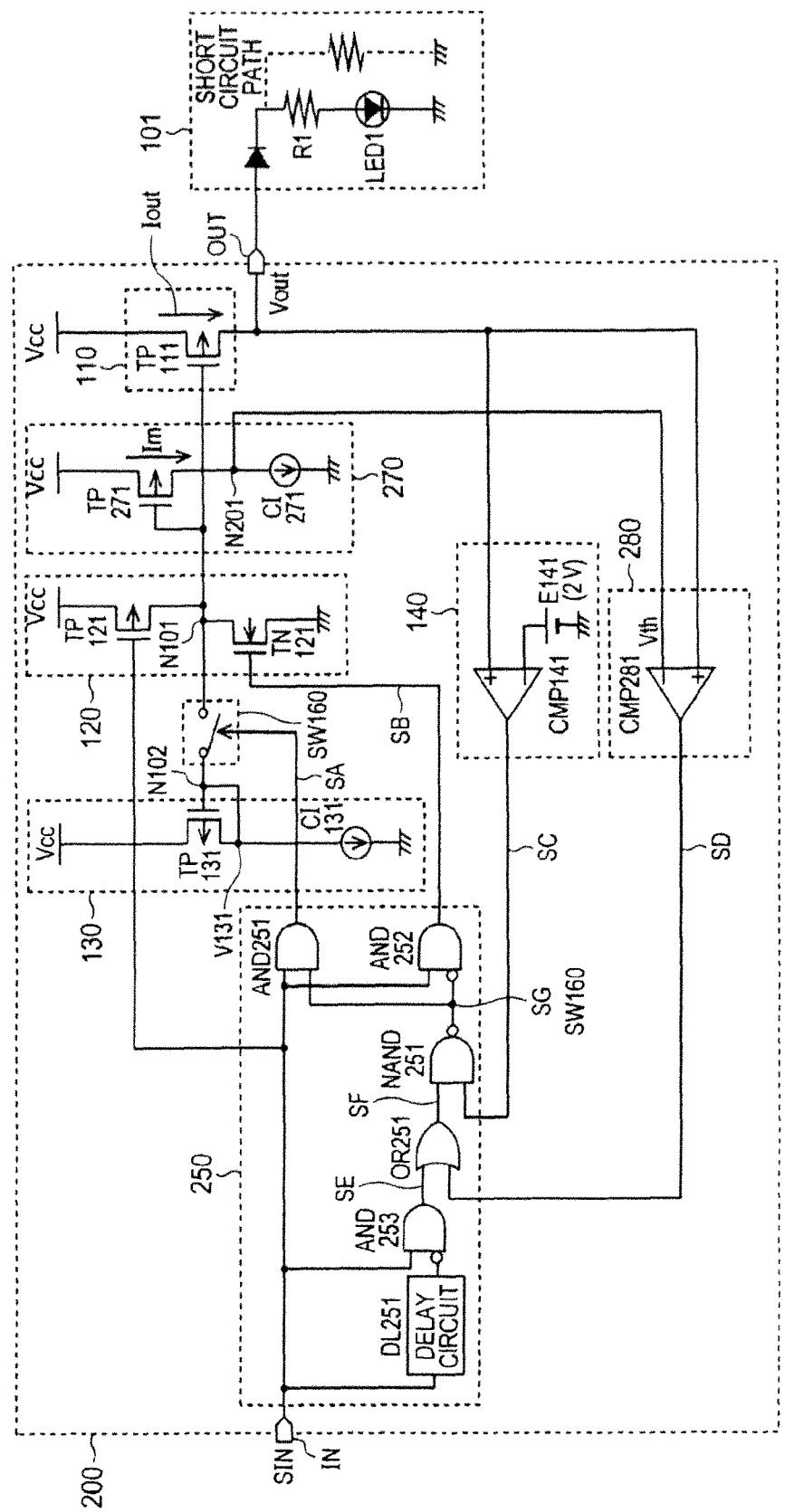
FIG. 5 is a block diagram showing a configuration of an output circuit according to a second embodiment of the invention.

FIG. 5 shows a configuration of an output circuit 200 according to the second embodiment of the invention. As shown in FIG. 5, the output circuit 200 includes an output unit 110, an output-drive circuit 120, a constant-current limiting circuit 130, output-voltage comparison circuits 140, 280, a drive-control circuit 250, a switch circuit SW 160, an output monitor circuit 270, an input terminal IN, and an output terminal OUT.

Each of reference numerals shown in FIG. 5, identical to each of those in FIG. 1, indicates a configuration identical, or similar to that shown in FIG. 1. The second embodiment differs from the first embodiment in that the output-voltage comparison circuit 280, and the output monitor circuit 270 are newly added, and the drive-control circuit 150 is replaced with the drive-control circuit 250. Accordingly, there are described hereinafter explanations about only parts of the second embodiment, differing from those of the first embodiment, thereby omitting explanations about parts of the second embodiment, identical to those of the first embodiment.

The output monitor circuit 270 includes a PMOS transistor TP 271, and a constant current source CI 271.

The PMOS transistor TP 271 has a source coupled to a power supply terminal Vcc, a drain coupled to a node N201, and a gate coupled to a node N101. The constant current source CI 271 is coupled between the node N201, and a ground terminal GND, and a constant current is outputted from the node N201 toward the ground terminal GND.

As described above, the gate of the PMOS transistor TP 271 is coupled to the node N101, as is the case with a PMOS transistor TP111. Accordingly, a potential at the gate of the PMOS transistor TP 271 is identical to that of the PMOS transistor TP111, thereby making up a mirror configuration. However, the output monitor circuit 270 is adjusted such that a current Im flowing through the PMOS transistor TP 271 corresponds to, for example, 1/100 of a current Iout flowing through the PMOS transistor TP111. As a method for implementing such adjustment, a ratio of a gate width of the PMOS transistor TP 271 to a gate width of the PMOS transistor TP111 (WTP 271/WTP 111) is rendered to a ratio of, for example, 1/100, and so forth.

Further, the output monitor circuit 270 is adjusted by the PMOS transistor TP 271, and the constant current source CI 271 such that the node N201 will be at a reference voltage Vth when the PMOS transistor TP111 as the output transistor is being driven. The reference voltage Vth is utilized in order to monitor whether or not an output voltage Vout is the predetermined voltage Vth, or higher, as described later on. This reference voltage Vth may be, for example, Vcc−1V.

The output-voltage comparison circuit 280 includes a comparator CMP 281. The comparator CMP 281 has a non-inverting input terminal coupled to the output terminal OUT, the output voltage Vout being inputted to the non-inverting input terminal. Further, the comparator CMP 281 has an inverting input terminal coupled to the node N201, the reference voltage Vth being inputted to the inverting input terminal. The output-voltage comparison circuit 280 outputs a result of comparison of the output voltage Vout with the reference voltage Vth, as a control signal SD.

Assuming that the reference voltage Vth is, for example, Vcc−1V, if the output voltage Vout is lower than Vcc−1V, the comparator CMP 281 outputs the control signal SD at a low level, and if the output voltage Vout is Vcc−1V, or higher, the comparator CMP 281 outputs the control signal SD at a high level.

The drive-control circuit 250 includes a delay circuit DL 251, AND circuits AND 251 to AND 253, a NAND circuit NAND 251, and an OR circuit OR 251.

The delay circuit DL 251 receives an input signal SIN, and adds a predetermined delay thereto before outputting a delay input signal.

The input signal SIN is delivered to one of input terminals of the AND circuit AND 253, and an inverting signal of the delay input signal from the delay circuit DL 251 is delivered to the other of the input terminals. Then, the AND circuit AND 253 outputs an operation result as a control signal SE.

The control signal SE is delivered to one of input terminals of the OR circuit OR 251, and the control signal SD is delivered to the other of the input terminals. Then, the OR circuit OR 251 outputs a logical OR operation result as a control signal SF.

The control signal SF is delivered to one of input terminals of the NAND circuit NAND 251, and the control signal SC is delivered to the other of the input terminals. Then, the NAND circuit NAND 251 outputs a NAND operation result as a control signal SG.

The input signal SIN is delivered to one of input terminals of the AND circuit AND 251, and the control signal SG is delivered to the other of the input terminals. Then, the AND circuit AND 251 outputs an AND operation result as a control signal SA.

The input signal SIN is delivered to one of input terminals of the AND circuit AND 252, and an inverting signal of the control signal SG is delivered to the other of the input terminals. Then, the AND circuit AND 252 outputs an AND operation result as a control signal SB.

The drive-control circuit 250, the output-voltage comparison circuits 140, 280, the switch circuit SW 160, and the output monitor circuit 270 can be regarded to configure one control circuit.

Figure 6:
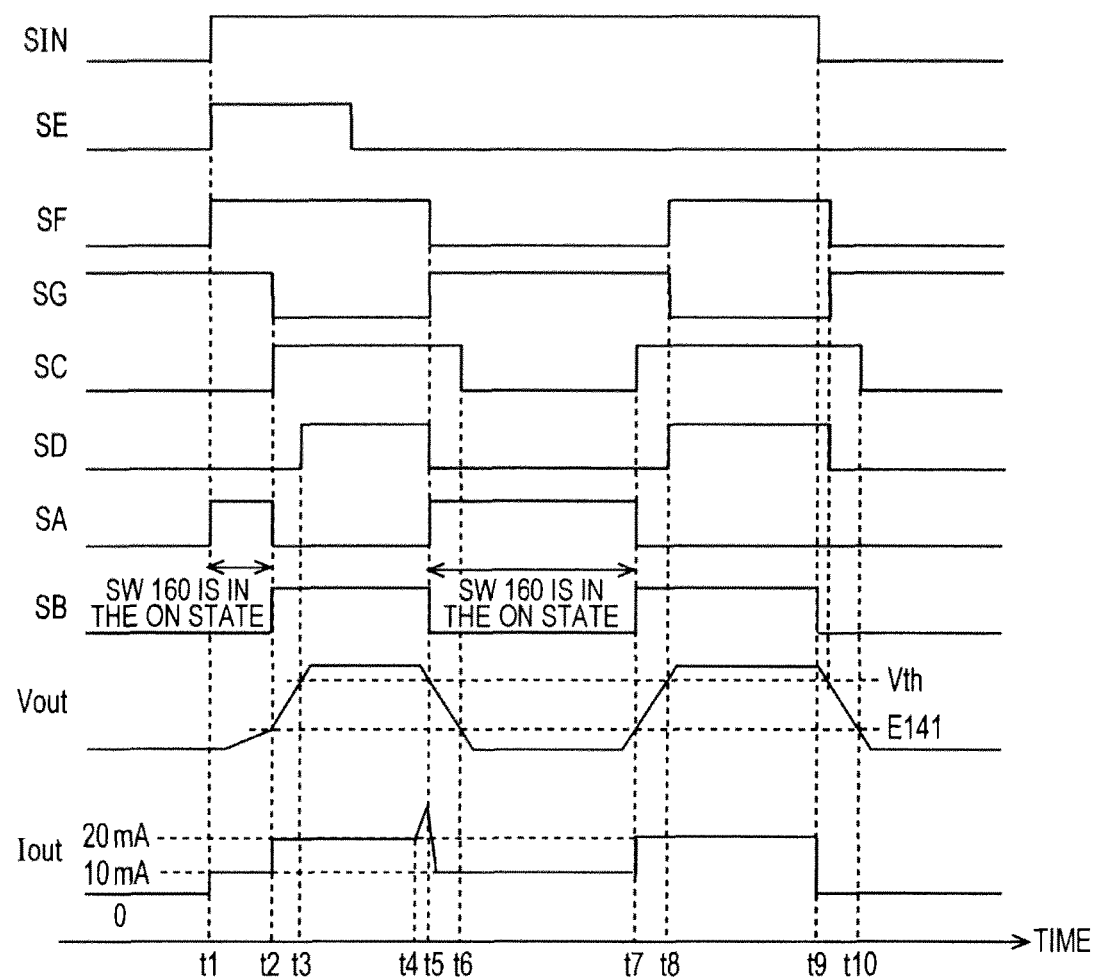
FIG. 6 is an operation timing chart of the output circuit according to the second embodiment.
Figure 7:
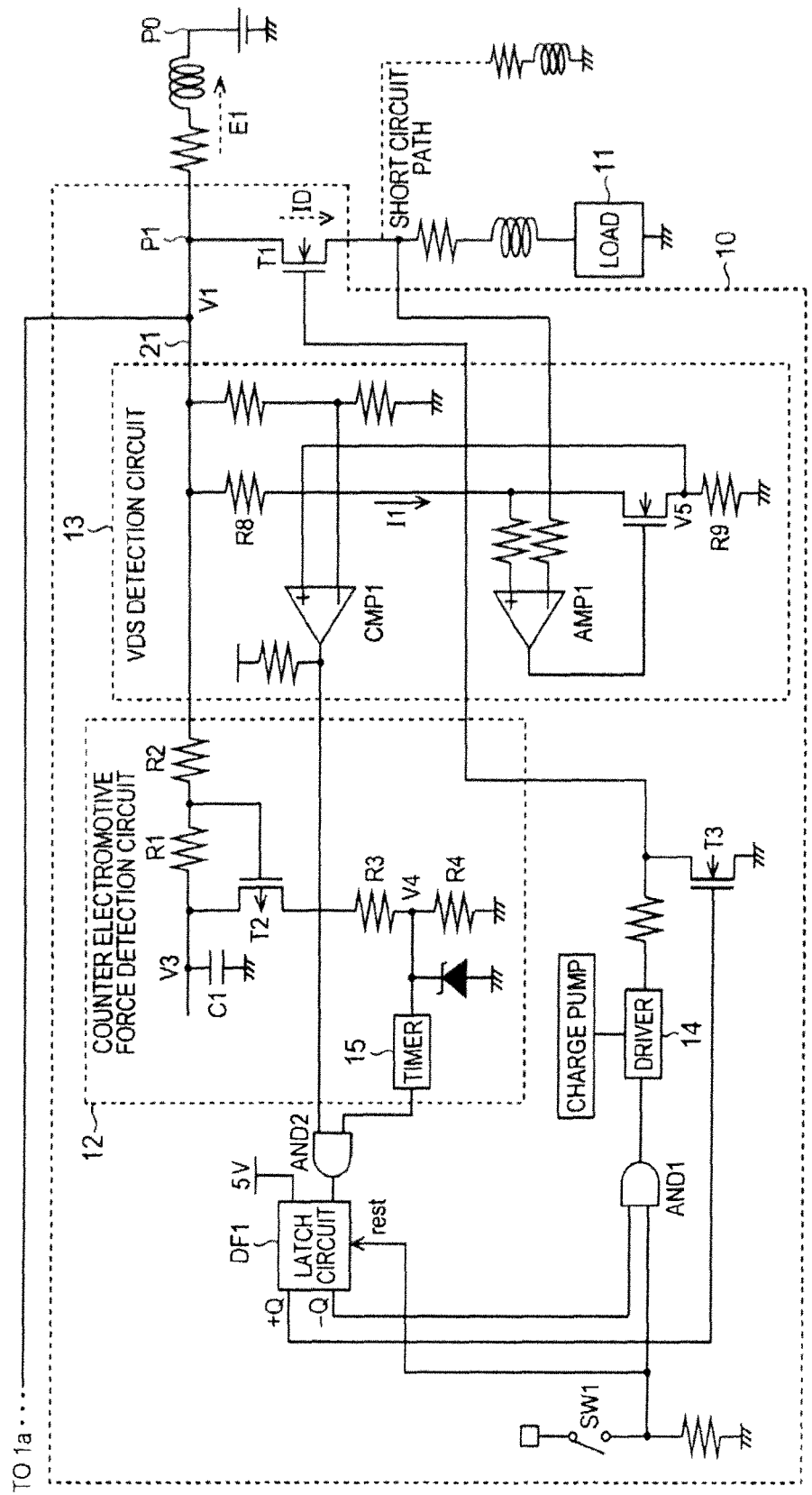
FIG. 7 is a block diagram showing a configuration of an output circuit according to a related art technology.
Figure 8:
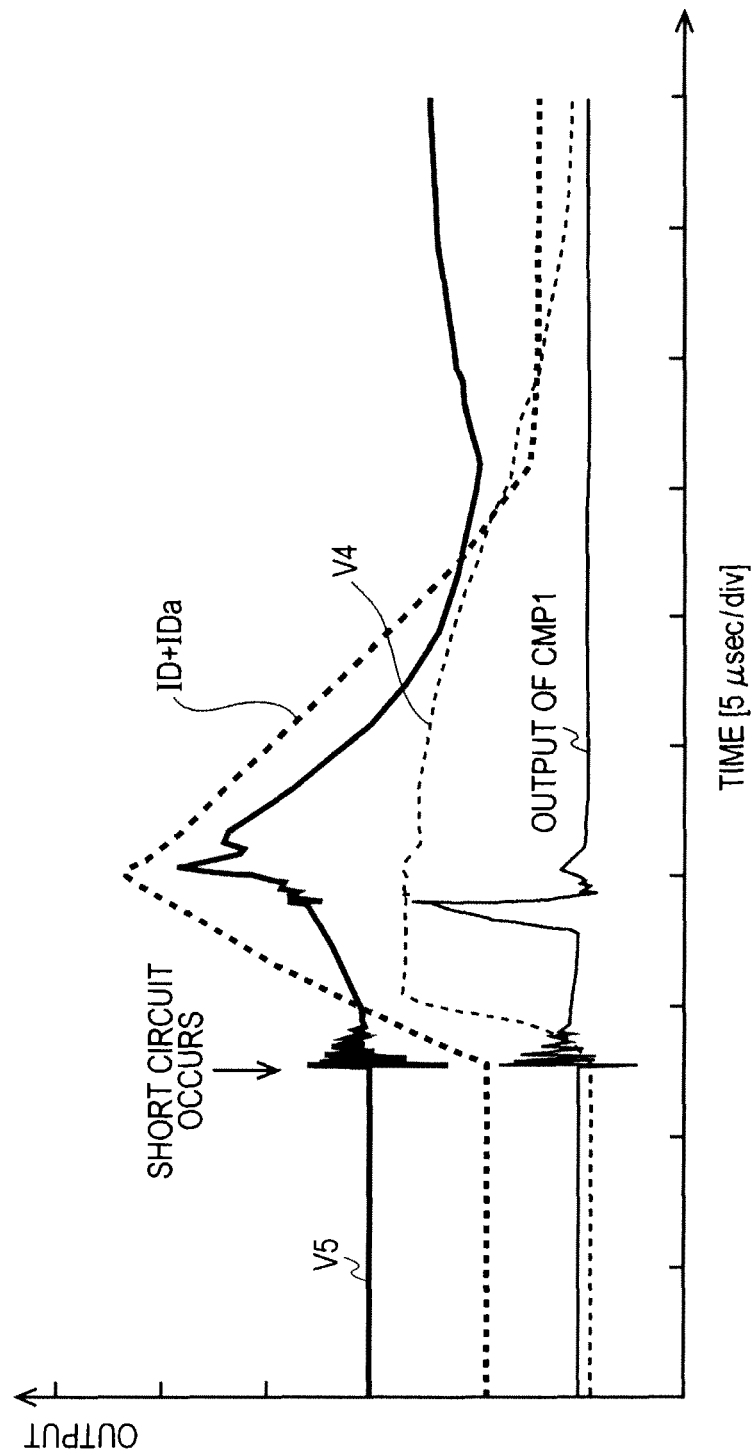
FIG. 8 is an operation timing chart of the output circuit according to the related art technology.

Next, an operation of the output circuit 200 according to the second embodiment is described hereinafter with reference to FIG. 6. FIG. 6 is an operation timing chart in the case where the short circuit to ground (earth ground) has occurred while a load 101 is being driven.

As shown in FIG. 6, the input signal SIN first makes a low level to a high level transition at time t1. The output voltage Vout appearing at the output terminal OUT at this point in time is at a low level (the ground voltage GND). Thus, the output voltage Vout is smaller in value than the reference voltage E 141 (for example, 2 V), so that the comparator CMP 141 of the output-voltage comparison circuit 140, outputs the control signal SC at a low level. Further, the comparator CMP 281 of the output-voltage comparison circuit 280, also outputs the control signal SD at a low level.

Meanwhile, the input signal SIN, and an inverting signal of the delay input signal delayed by a predetermined period are respectively inputted to the AND circuit AND 253, and the AND circuit AND 253 causes the control signal SE to make a low level to a high level transition during a predetermined time period. By so doing, the OR circuit OR 251 causes the control signal SF to make a low level to a high level transition. Further, since the control signal SC inputted to the one input terminal of the NAND circuit NAND 251 is at the low level, the control signal SG is held at the high level.

Further, as the input signal SIN makes the low level to the high level transition, the AND circuit AND 251 causes the control signal SA to make a low level to a high level transition, whereupon the switch circuit SW 160 is turned ON.

Further, as the control signal SG is at the high level, the control signal SB remains at the low level by the action of the AND circuit AND 252 receiving the inverting signal of the control signal SG, thereby keeping the NMOS transistor TN121 in the OFF state, and as the input signal SIN is at the high level, the PMOS transistor TP121 is in the OFF state. That is, the output-drive circuit 120 is in a deactivated state, having no effect on the action of the output unit 110.

When the switch circuit SW 160 is turned ON, the node N102 is rendered electrically continuous with the node N101. In consequence, the voltage V131 as the drain voltage (the gate voltage) of the PMOS transistor TP131 of the constant-current limiting circuit 130 will be at a potential equal to that of the gate voltage of the PMOS transistor TP111 of the output unit 110. Accordingly, the PMOS transistor TP111 will be in the limited-drive state as described in the case of the first embodiment.

Further, the output current Iout (10 mA) is outputted by the PMOS transistor TP111 in the limited-drive state, and the output current Iout flows to the load 101, whereupon the output voltage Vout gradually rises. Then, upon the output voltage Vout exceeding the reference voltage E 141 (for example, 2 V) at time t2, the comparator CMP 141 outputs the control signal SC at the high level. Upon the control signal SC making a transition to the high level, the NAND circuit NAND 251 causes the control signal SG to make a high level to a low level transition.

Upon the control signal SG making the transition to the low level, the AND circuit AND 251 causes the control signal SA to make a high level to a low level transition while the AND circuit AND 252 causes the control signal SB to make a low level to a high level transition. Upon the control signal SA making a transition to the low level, the switch circuit SW 160 is turned OFF, whereupon the node 102 is electrically cut off from the node N101. Accordingly, the voltage V131 is not transmitted to the node N101.

Further, as the control signal SB concurrently makes the transition to the high level, the NMOS transistor TN121 is tuned ON, thereby causing the node N101 to be at the low level (the ground voltage GND). Accordingly, the PMOS transistor TP111 as the output transistor will not be in the limited-drive state as restricted by the constant-current limiting circuit 130 (the output current Iout=10 mA), but will be in the normal drive state (the output current Iout=20 mA) in the normal ON state, thereby driving the load 101.

Further, the output current Iout (20 mA) outputted by the PMOS transistor TP111 in the limited-drive state will flow to the load 101, and the output voltage Vout will undergo a further rise. If the output voltage Vout exceeds the reference voltage Vth (for example, Vcc−1V) at time t3, the comparator CMP 281 outputs the control signal SD at the high level.

Next, there is described hereinafter the case where the short circuit to ground (earth ground) has occurred to the load 101 at time t4. Herein, as a specific example of numerical values, it is assumed that the power supply voltage at the terminal Vcc is 10 V, the ON resistance of the PMOS transistor TP111 is 10Ω, and the impedance of the load 101 in the normal state (without the occurrence of the short circuit to ground) is 490Ω. In this case, the output current Iout flowing from the PMOS transistor TP111 of the output unit 110 is a current having a value of 20 mA obtained by dividing the power supply voltage (10 V) by the sum (500Ω) of the ON resistance (10Ω) of the PMOS transistor TP111, and the impedance (490Ω) of the load 101. At this point in time, the output voltage Vout will be 9.8 V.

Assuming that the short circuit to ground (earth ground) occurs to the load 101 at the time t4 as described above, and the impedance of the load 101 undergoes a change from 490Ω to 10Ω, the output current Iout will undergo an abrupt increase from 20 mA to 500 mA (=10 V/20Ω). In this case, the output voltage Vout is prone to fall to 5 V. However, at time t5, the output voltage Vout falls below the reference voltage Vth set to, for example, 9 V (=Vcc−1 V), so that the comparator CMP 281 causes the control signal SD to make a high level to a low level transition. As a result of such a transition, the NAND circuit NAND 251 causes the control signal SG to make a high level to a low level transition. Then, in so doing, the AND circuit AND 251 causes the control signal SA to make a low level to a high level transition, and the AND circuit AND 252 causes the control signal SB to make a high level to a low level transition. Accordingly, the PMOS transistor TP111 will be in the limited-drive state again, the same state as existed between the tine t1 and the time t2, thereby preventing flow of the output current Iout (500 mA) large in value, as described above.

Further, assuming that the output current Iout outputted by the PMOS transistor TP111 in the limited-drive state is 10 mA), the output voltage Vout will fall down to on the order of 0.1 V. Then, because the output voltage Vout will fall below the reference voltage E 141 (2 V) at time t6, the comparator CMP 141 causes the control signal SC to make a high level to a low level transition.

Then, if the short circuit to ground (earth ground) at the load 101 is cancelled, the output voltage Vout will rise again, reaching the reference voltage E 141 (2 V), or higher at time t7. Accordingly, the comparator CMP 141 outputs the control signal SC at the high level as the comparator CMP 141 did at the time t2. Then, the NAND circuit NAND 251 causes the control signal SG to make the high level to the low level transition, and the AND circuit AND 251 causes the control signal SA to make the high level to the low level transition, while the AND circuit AND 252 causes the control signal SB to make the low level to the high level transition again. As the control signal SA makes the transition to the low level, the switch circuit SW 160 is turned OFF, whereupon the node 101 is electrically cut off from the node N102, and the PMOS transistor TP111 is shifted from the limited-drive state (the output current Iout=10 mA) to the normal drive state (the output current Iout=20 mA), thereby driving the load 101.

Further, the PMOS transistor TP111 is shifted to the normal drive state, causing the output voltage Vout to rise, and the output voltage Vout exceeds the reference voltage Vth at time t8 as the output voltage Vout did at the time t3, whereupon the comparator CMP 281 outputs the control signal SD at the high level.

Thereafter, if the input signal SIN makes a high level to a low level transition at time t9, the PMOS transistor TP121 is turned OFF, and further, the AND circuit AND 252 causes the control signal SB to make the high level to the low level transition, thereby turning the NMOS transistor TN121 into the OFF state. Accordingly, the output-drive circuit 120 is deactivated, so that the output current Iout stops flowing, and the output voltage Vout falls.

In this case, even if the output voltage Vout falls below the reference voltage Vth, the control signal SA does not make a transition to the high level this time, and the switch circuit SW 160 is held in the OFF state. Accordingly, the PMOS transistor TP 111 will not be in the limited-drive state, and at time t10, and onwards, the PMOS transistor TP 111 will remain in the same state as existed before the time t1.

Further, in the case where the short circuit to ground (earth ground) has occurred to the load 101 since before the time t1, the control signal SA will be held at the high level without making a transition to the low level. Accordingly, the PMOS transistor TP 111 will be kept in the limited-drive state, being kept in a state substantially identical to such a state of the first embodiment as described with reference to FIG. 3, omitting therefore description of this state in the case of the second embodiment.

Further, as described above, with the output circuit 200 according to the second embodiment of the invention, if the short circuit to ground (earth ground) occurs to the load 10 at the time t4, the output current Iout undergoes an abrupt increase. However, the output voltage Vout at this point in time t4 can be set according to a value of the reference voltage Vth. Assuming that the reference voltage Vth is Vcc−0.2 V, the output current Iout in the case of the short circuit to ground occurring at the time t4 can be set to 40 mA.

As described in the foregoing, with the output circuit 200 according to the second embodiment of the invention, an operation is started from the constant-current drive state to be shifted to the normal drive state unless the short circuit to ground occurs, as is the case with the output circuit 100 according to the first embodiment of the invention. Further, because the output monitor circuit 270 for monitoring the output voltage Vout, and the output-voltage comparison circuit 280 are additionally provided, it becomes possible to prevent the output current large in value from being outputted by shifting the PMOS transistor TP111 to the constant-current driving (the limited-drive state) with the use of the reference voltage Vth higher than the reference voltage E 141, serving as a trigger, when the short circuit to ground occurs. Hence, there is no need for enlarging the circuit scale so as to match the worst value of the output current flowing to the short-circuited ground as described in connection with the first embodiment, thereby preventing the enlargement of the circuit scale. Furthermore, the second embodiment has a similar advantageous effect of enhancing circuit safety without having a concern with possible breakage of the power supply circuit.

Having described the embodiments of the invention as above, it is to be pointed out that the invention be not limited thereto, and that various changes and modifications may be made in the invention without departing from the spirit and scope thereof. For example, with circuitry configurations of the output circuits 100, 200, shown in FIGS. 1, 5, respectively, if the configuration is altered changed such that a relationship between the power supply voltage at the terminal Vcc, and the ground voltage (GND) is reversed, and conductivity types of the respective MOS transistors are reversed, this will enable the invention to cope with short circuit to power supply (shorted to power supply).

What is claimed is:
1. A drive circuit, comprising:
an input port;
an output port coupled to a load circuit;
an output circuit that outputs one of a first current and a second current to the load circuit, the first current having a predetermined current value and the second current having a current value higher than the predetermined current value; and
a short-circuit detection circuit that detects a short circuit at the load circuit,
wherein the output circuit outputs the first current based on a control signal, wherein the output circuit switches to output the second current when the short-circuit detection circuit does not detect the short circuit after the first current is outputted, and wherein the output circuit includes a current mirror circuit to generate the first current.

2. The drive circuit according to claim 1, wherein the output circuit switches to output the first current when the short-circuit detection circuit detects the short circuit after the second current is outputted.

3. The drive circuit according to claim 2, wherein the output circuit switches to output the second current when the short circuit is cancelled.

4. The drive circuit according to claim 1, wherein the short-circuit detection circuit detects the short circuit when an output voltage of the drive circuit is lower than a first predetermined voltage.

5. The drive circuit according to claim 1, wherein a mirror ratio of the mirror circuit is 1:n, where n is an integer greater than 1.

* * * * *